United States Patent

Hakamata

[11] Patent Number: 5,939,818
[45] Date of Patent: Aug. 17, 1999

[54] PIEZOELECTRIC TRANSFORMER, ITS MANUFACTURING METHOD AND ITS DRIVING METHOD

[75] Inventor: Hiroyo Hakamata, Tokyo, Japan

[73] Assignee: NEC Corporation, Tokyo, Japan

[21] Appl. No.: 08/899,825

[22] Filed: Jul. 24, 1997

Related U.S. Application Data

[63] Continuation of application No. 08/598,997, Feb. 9, 1996, abandoned.

[30] Foreign Application Priority Data

Feb. 15, 1995 [JP] Japan ......................................... 025747

[51] Int. Cl.[6] .................................................. H01L 41/08
[52] U.S. Cl. .......................... 310/359; 310/366; 310/369
[58] Field of Search .................................... 310/316, 317, 310/319, 366, 358, 359

[56] References Cited

U.S. PATENT DOCUMENTS

| | | | |
|---|---|---|---|
| 2,974,296 | 3/1961 | Rosen | 310/359 |
| 3,598,909 | 8/1971 | Sasaki et al. | 178/7.3 R |
| 3,610,969 | 10/1971 | Clawson et al. | 310/8.1 |
| 3,622,813 | 11/1971 | Kumon | 310/8.1 |
| 3,736,446 | 5/1973 | Berlincourt | 310/359 |
| 5,365,141 | 11/1994 | Kawai et al. | 310/359 |
| 5,402,031 | 3/1995 | Tagami et al. | 310/359 |
| 5,424,602 | 6/1995 | Satoh et al. | 310/359 |
| 5,463,266 | 10/1995 | Fukuoka et al. | 310/359 |
| 5,576,590 | 11/1996 | Ohnishi et al. | 310/359 |

FOREIGN PATENT DOCUMENTS

| | | |
|---|---|---|
| 0555887A1 | 8/1993 | European Pat. Off. . |
| 2-82672 | 3/1990 | Japan . |
| 6-338641 | 12/1994 | Japan . |
| 6-338643 | 12/1994 | Japan . |
| 7193293 | 7/1995 | Japan . |

*Primary Examiner*—Mark O. Budd
*Attorney, Agent, or Firm*—Whitham, Curtis & Whitham

[57] ABSTRACT

In a piezoelectric transformer having a piezoelectric body in polarized condition, input electrodes provided on the surface of the piezoelectric body and applied an alternating voltage of a frequency depending upon the resonance frequency of the piezoelectric body and a leading electrode provided on the surface of the piezoelectric body and taking out a voltage depending upon vibration of the piezoelectric body, and a grounding electrode is further provided on the surface of the piezoelectric body and electrically isolated from the input electrode and taking out output voltage in cooperation with the leading electrode by forming a pair, depending on the vibration of the piezoelectric body. Thus, even when an alternating voltage having a frequency equal to the resonance frequency of the piezoelectric body, respective junctions have sufficient strength against vibration.

17 Claims, 14 Drawing Sheets

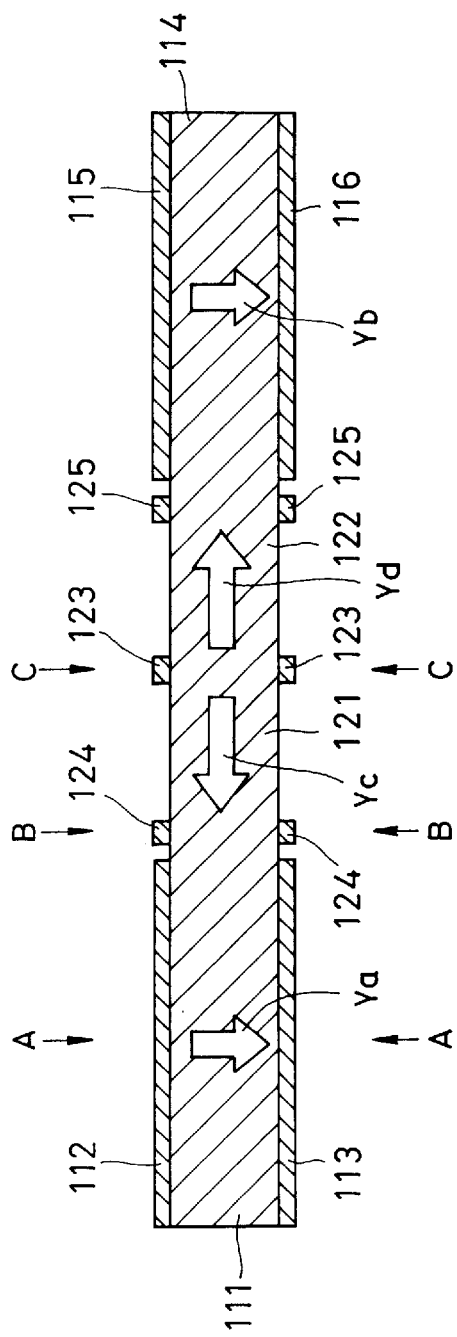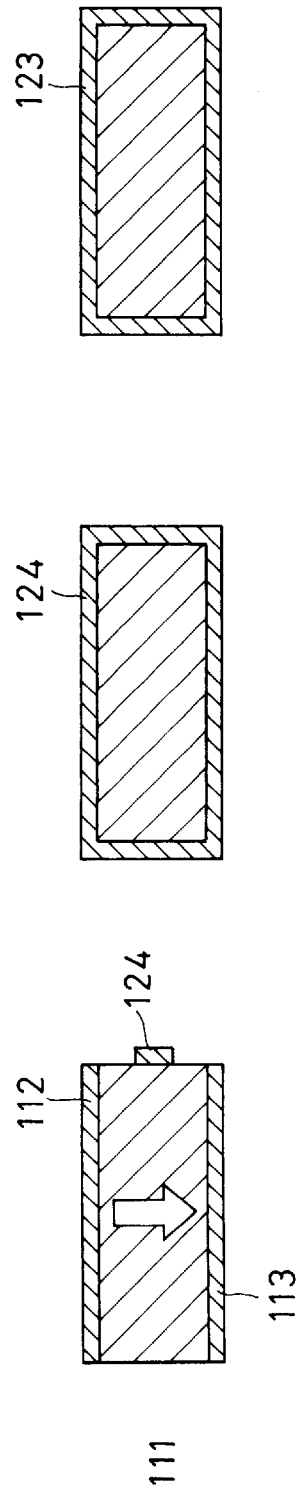

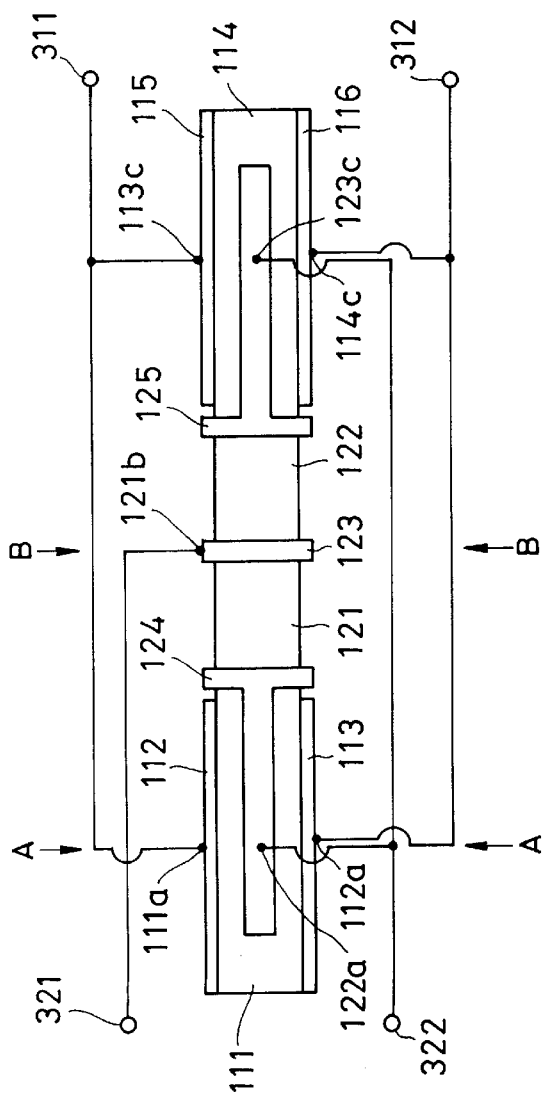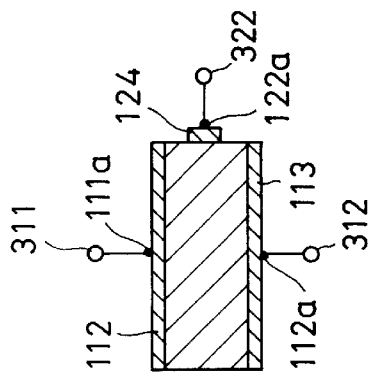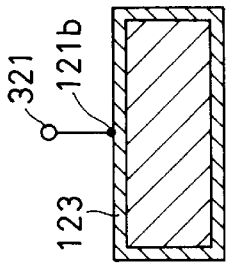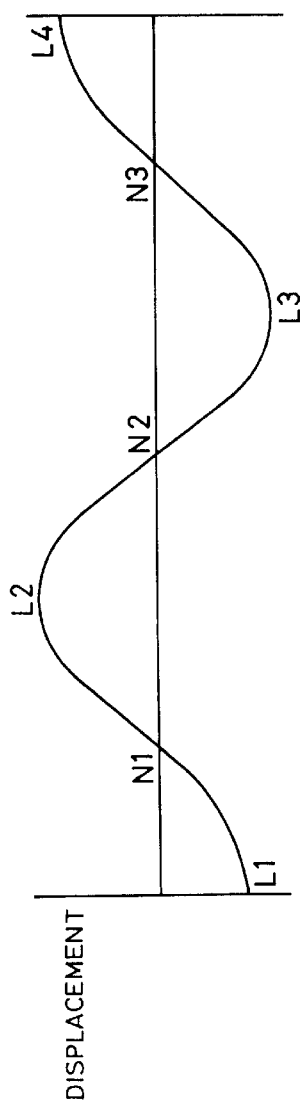

FIG.4A
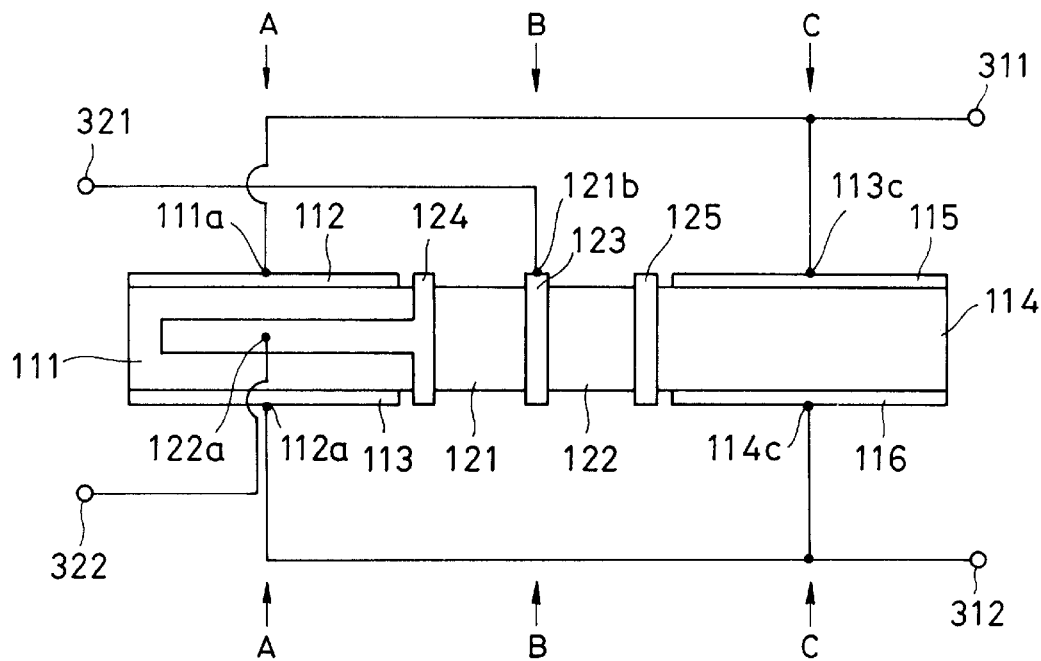
FIG.4B  FIG.4C  FIG.4D
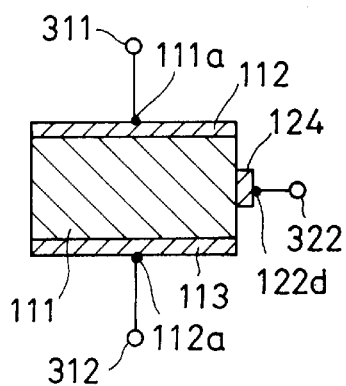 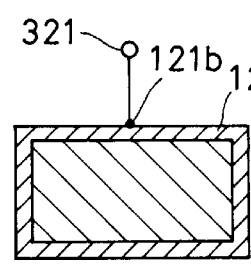 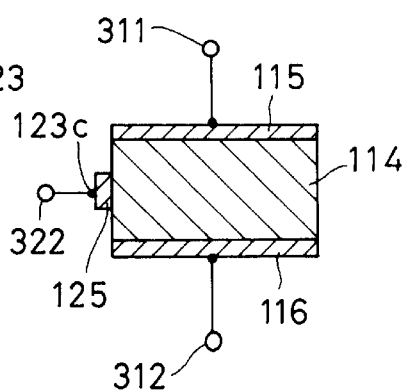

PIEZOELECTRIC TRANSFORMER, ITS MANUFACTURING METHOD AND ITS DRIVING METHOD

This is a Continuation of application Ser. No. 08/598,997 filed Feb. 9, 1996, now abandoned.

BACKGROUND OF THE INVENTION

1. Field of the Invention

The present invention relates generally to a piezoelectric transformer, a manufacturing method and a driving method thereof. The invention relates to a piezoelectric transformer to be employed in a deflector device of a television receiver, a charge device of a copy machine and so forth, and a manufacturing method and driving method thereof.

2. Description of Related Art

In general, in a power source circuit in an apparatus which requires high voltage, such as a deflector device of a television receiver, a charge device of a copy machine and so forth, a winding type electromagnetic transformer have been employed as a transformer element for generating high voltage. The electromagnetic transformer has a construction, in which a conductive wire is wound around a core of a magnetic body, Therefore, in order to realize a high transformation ratio, a number of turns of the conductive wire wound around the core has to be increased. Therefore, it is quite difficult to realize a compact and thin electromagnetic transformer.

On the other hand, there has been proposed a piezoelectric ceramic transformer (hereinafter referred to as a "piezoelectric transformer") employing piezoelectric effect. Such a piezoelectric transformer has been used in a resonating condition. In comparison with the electromagnetic transformer, (1) wiring structure is unnecessary and energy density is high, the transformer can be made compact and thin, (2) the transformer can be made non-inframable, and (3) noise due to electromagnetic induction or so forth is not present, and large number of other advantages are present.

However, on the other hand, since the piezoelectric transformer operates in a resonating condition, connecting structure between respective components of the transformer, particularly an extracting structure of a terminal (external terminal) for external electrical connection, has to have a structure which can guarantee high reliability of connection to withstand against vibration associated with transforming operation.

In view of reliability of connection set forth above, a Roazen type piezoelectric transformer as one example of the piezoelectric transformer is considered. FIG. 13 is a perspective view showing a construction of the Roazen type piezoelectric transformer. FIG. 14A is a section taken along line L—L along a longitudinal direction of the transformer of FIG. 13 and a diagrammatic illustration showing a connecting condition with the external terminal.

Referring to FIG. 13, at both ends in the longitudinal direction of a piezoelectric plate in elongated plate structure, two driving portions 91a and 91b having low impedance are provided respectively. On the upper surface of the driving portion 91a at the left side in the drawing, an electrode 912 is provided. On the lower surface, an electrode 913 is provided. Similarly, on upper and lower surfaces of the driving portion 91b at the right side, electrodes 915 and 916 are provided.

In these two driving portions 91a and 91b, as shown in FIG. 14A, both of upper electrodes 912 and 915 are connected to an external terminal 917 and both of lower electrodes 913 and 916 are connected to an external terminal 918. Both of piezoelectric plates 911 and 914 at the driving portions 91a and 91b are polarized in the direction of thickness as shown by arrows Ya and Yb in the drawing.

In the portion positioned at the center portion located between two driving portions 91a and 91b, a generator portion 92 having high impedance, is present. At the center of the generating portion 92, a strip-shaped electrode 923 is provided surrounding the circumference of the piezoelectric plate at this portion. The electrode 923 is connected to an external terminal 919 (see FIG. 14A). The piezoelectric plates 921 and 922 at portions between the electrode 923 and two driving portions 91a, 91b, respectively, are oppositely polarized in the longitudinal direction across the electrode 923 as shown by arrows Yc and Yd in the drawing.

When a high voltage is taken from this piezoelectric transformer, the transformer operates as follows. When an alternating voltage is applied to the electrodes 912 and 913 from external terminals 917 and 918 in case of the driving portion 91a, (915 and 916 in case of the driving portion 91b), at the driving portion 91, an alternating current voltage field is applied in the polarizing direction of the piezoelectric plate 911 (or 914). Then, by a so-called piezoelectric transverse effect 31 mode in which displacement in the perpendicular direction relative to the polarizing direction of the piezoelectric plate is caused by the alternating current voltage field, longitudinal vibration is applied to the piezoelectric plate 921 (or 922) in the longitudinal direction to cause vibration on the overall transformer.

On the other hand, in the generating portion 92, in response to longitudinal vibration in the longitudinal direction, by a so-called piezoelectric longitudinal effect 33 mode in which potential difference is generated in the polarizing direction due to mechanical distortion caused in the polarizing direction of the piezoelectric plate, a voltage is generated between the electrodes 923 and 912 (or 915) or between the electrodes 923 and 913 (or 916). This voltage is taken as the output voltage from the external terminal 919. At this time, when the frequency of an alternating drive voltage applied between the external terminals 917 and 918 is set equal to the resonance frequency of the piezoelectric transformer, quite high output voltage can be obtained.

It should be noted that when a low voltage is to be output by inputting high voltage, the high impedance generating portion 92 causing the piezoelectric longitudinal effect is taken as an input side and low impedance driving portion 91 causing piezoelectric transverse effect is taken as an output side for operation.

Here, concerning reliability of connection, discussion will be given for mounting positions of the external terminals 917, 918, 919 in the Roazen type piezoelectric transformer to respective electrodes 912, 913, 915, 916 and 923.

Referring to FIG. 14A, the terminal 917 at the driving portion side is connected to the electrode 912 in the driving portion 91a and the electrode 915 in the driving portion 91b via junctions 911a and 913c, respectively. Similarly, another terminal 918 at the driving portion side is connected to the electrode 913 in the driving portion 91a and the electrode 916 in the driving portion 91b via junctions 912a and 914c, respectively. On the other hand, the terminal 919 at the generator portion side is connected to the electrode 923 in the generator portion 91 via a junction 921b.

Here, with reference to FIG. 14B illustrating distribution of displacement in the longitudinal direction in longitudinal vibration tertiary mode in the length of the transformer, this mode is a vibration mode, in which 3/2 wavelength of the longitudinal vibration is equal to the entire length of the piezoelectric transformer, in which three nodes of vibration N1, N2 and N3 and four peaks of vibration L1, L2, L3, L4 are present. Comparing the positions of the nodes of vibration and the positions of respective junctions of the external terminals, the junctions 911a and 912a can be matched with the node N1, the junctions 921b can be matched with the node N2 and the junctions 913c and 914c are matched with the node N3. Namely, this type of piezoelectric transformer can arrange all of the junctions for connection of the external terminals at the nodes of vibration to assure good vibration characteristics and reliability of connection.

On the other hand, considering that the piezoelectric transformer is designed to extract high voltage, in view of security of the equipment to which the transformer is assembled, such as high voltage generating power source circuit and so forth and freedom of circuit design, the terminal structure is desirable to be a four terminal structure, namely, a pair of input terminals and a pair of output terminals, and thus four terminals in total are isolated from one another. However, in the conventional piezoelectric ceramic transformer, it is difficult to achieve both of the foregoing two points.

Namely, in the conventional piezoelectric transformer, there is only one electrode 923 for extracting generated voltage from the generator portion 92. In other words, the output side terminal is only one terminal 919. This type of transformer is basically a three terminal structure. Accordingly, upon practical use, one of two terminals 917 and 918 at the driving portion side has to serve as a common terminal for input and output.

SUMMARY OF THE INVENTION

The present invention is for solving the problems in the prior art. Therefore, it is an object of the present invention to provide a piezoelectric transformer which has a four terminal structure, in which four terminals for inputting and outputting are mutually isolated from each other.

Another object of the present invention is to provide a piezoelectric transformer, in which the four terminals of a driving portion and a generator portion can be extracted at nodes of vibration, and thereby to have superior reliability of connection, security in use and freedom in circuit designing.

A further object of the invention is to provide a manufacturing method which can suppress increasing of cost in manufacturing of component electrodes and can maintain high yield.

A still further object of the present invention is to provide a driving method which can exhibit high reliability of terminal connection and high voltage, high power output characteristics.

According to the first aspect, a piezoelectric transformer comprising:

a piezoelectric body in polarized condition;

input electrodes provided on the surface of the piezoelectric body and applied an alternating voltage of a frequency depending upon the resonance frequency of the piezoelectric body;

a leading electrode provided on the surface of the piezoelectric body and taking out a voltage depending upon vibration of the piezoelectric body; and a grounding electrode provided on the surface of the piezoelectric body and electrically isolated from the input electrodes, wherein an output voltage is taken out between said leading electrode and said grounding electrode.

According to a second aspect of the invention, a piezoelectric transformer comprising:

a plate form piezoelectric body having a length corresponding to 3/2 of a wavelength corresponding to a resonance frequency;

first and second driving portions provided at one primary surface and the other primary surface at both ends in the length direction of the piezoelectric body and having input electrodes, to which an alternating voltage having a frequency depending upon the resonance frequency; and a generator portion positioned at about 1/2 in the length direction of the piezoelectric body and having a leading electrode for taking out an alternating voltage depending upon the alternating current applied to the first and second driving portions and a grounding electrode forming a pair with the leading electrode for taking out a voltage depending upon vibration of the piezoelectric body, said grounding electrode being electrically isolated from said input electrodes.

According to the third aspect of the invention, a piezoelectric transformer comprising:

a disc form piezoelectric body having a length corresponding to 3/2 of a wavelength corresponding to a resonance frequency;

a driving portion provided at central portions of the piezoelectric body and having input electrodes formed on one primary surface and the other primary surface of said driving portion, to which an alternating voltage having a frequency depending upon the resonance frequency is applied; and a generator portion located at the circumference of the piezoelectric body and having a leading electrode for taking out an alternating voltage depending upon the alternating current applied to the input electrodes and a grounding electrode forming a pair with the leading electrode for taking out a voltage depending upon vibration of the piezoelectric body, said grounding electrode being electrically isolated from said input electrodes.

According to the fourth aspect of the invention, a manufacturing method of a piezoelectric transformer including a piezoelectric body in polarized condition, input electrodes provided on the surface of the piezoelectric body and applied an alternating voltage of a frequency depending upon the resonance frequency of the piezoelectric body, a leading electrode provided on the surface of the piezoelectric body and taking out a voltage depending upon vibration of the piezoelectric body, and a grounding electrode provided on the surface of the piezoelectric body and electrically isolated from the input electrode and taking out output voltage in cooperation with the leading electrode by forming a pair, the method comprising the steps of:

forming the input electrodes and the grounding electrode; and applying an electric field to the piezoelectric body after the formation of the electrodes.

According to the fifth aspect of the invention, a manufacturing method of a piezoelectric transformer including a piezoelectric body in polarized condition, input electrodes provided on the surface of the piezoelectric body and applied an alternating voltage of a frequency depending upon the resonance frequency of the piezoelectric body, a leading electrode provided on the surface of the piezoelectric body and taking out a voltage depending upon vibration of the piezoelectric body, and a grounding electrode provided on the surface of the piezoelectric body and electrically isolated from the input electrode and taking out output voltage in cooperation with the leading electrode by forming a pair, the method comprising the steps of:

forming the input electrodes;

applying an electric field to the piezoelectric body after the formation of the input electrodes; and forming the grounding electrode after application of the electric field.

According to the sixth aspect of the invention, a driving method of a piezoelectric transformer including a piezoelectric body in polarized condition, input electrodes provided on the surface of the piezoelectric body and applied an alternating voltage of a frequency depending upon the resonance frequency of the piezoelectric body, a leading electrode provided on the surface of the piezoelectric body and taking out a voltage depending upon vibration of the piezoelectric body, and a grounding electrode provided on the surface of the piezoelectric body and electrically isolated from the input electrode and taking out output voltage in cooperation with the leading electrode by forming a pair, the method characterized in that an alternating voltage having a frequency equal to a resonance frequency of the piezoelectric body is applied to the input electrodes.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings:

FIG. 2A is a section of the piezoelectric transformer of FIG. 1;

FIGS. 2B to 2D are sections at respective portions in FIG. 2A;

FIG. 3A is a diagrammatic illustration showing an electrical circuit connection of the piezoelectric transformer of FIG. 1;

FIGS. 3B and 3C are sections in respective portions in FIG. 3A;

FIG. 3D is a chart showing distribution of displacement in the longitudinal direction in the longitudinal vibration tertiary mode in the length of the piezoelectric transformer;

FIG. 4A is a diagrammatic illustration showing electrical circuit connection of the piezoelectric transformer in the structure, in which leg portions of a T-shaped electrode are not formed in the same side surface;

FIGS. 4B to 4D are sections showing respective portions in FIG. 4A;

DESCRIPTION OF THE PREFERRED EMBODIMENTS

Next, the present invention will be discussed in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order not to obscure the present invention.

Figure 1:
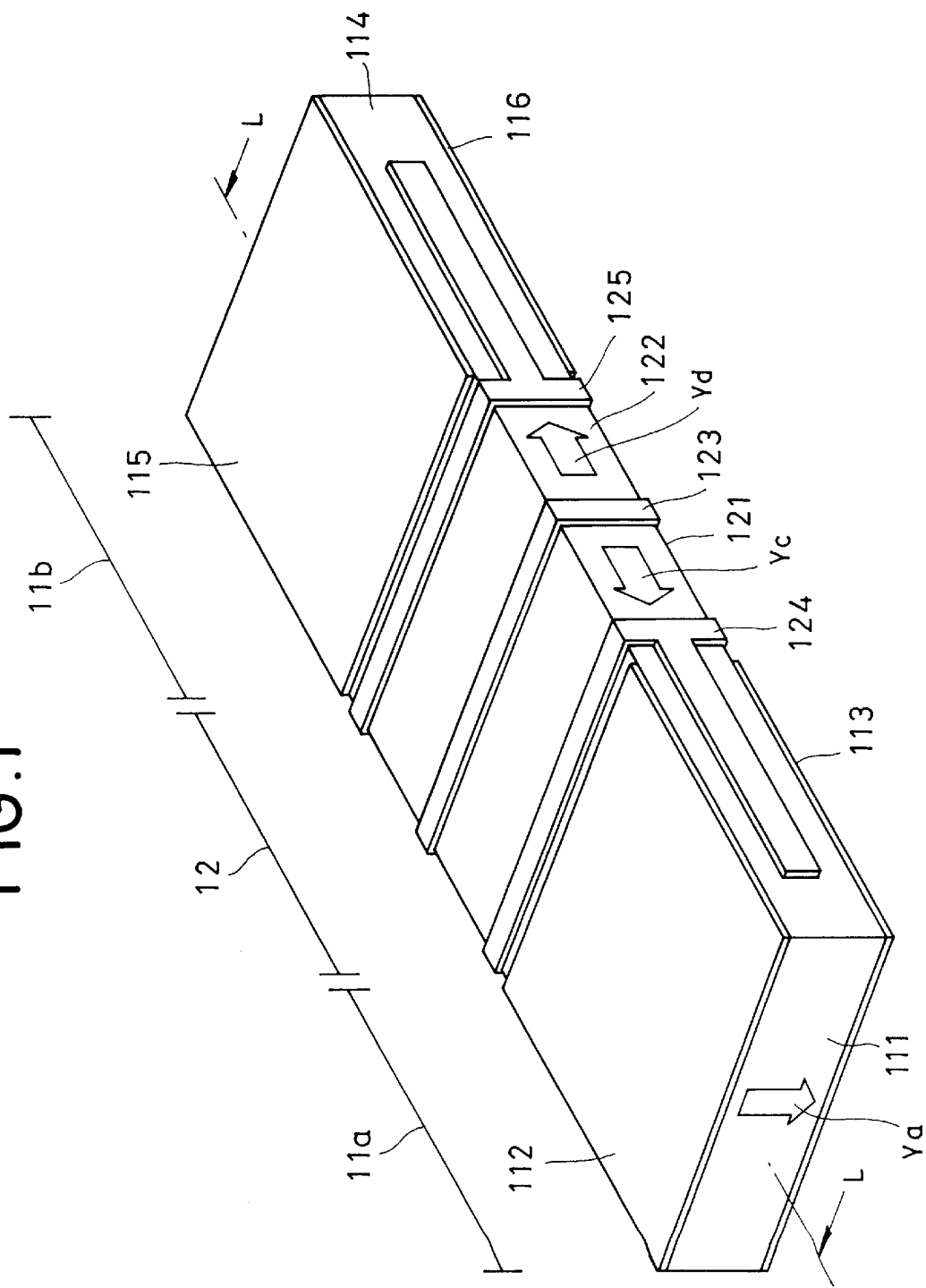
FIG. 1 is a perspective view showing a construction of the first embodiment of a piezoelectric transformer according to the present invention.

FIG. 1 is a perspective view showing a construction of the first embodiment of a piezoelectric transformer according to the present invention. FIG. 2A is a section taken along line L—L of FIG. 1, and FIGS. 2B, 2C and 2D are sections respectively taken along mutually parallel cut lines in the width direction of an elongated plate respectively at A—A portion, B—B portion and C—C portion in FIG. 1.

In FIG. 1, the first embodiment of the piezoelectric transformer according to the present invention has a construction to have a grounding electrode for taking out a generated voltage at a generator portion between a leading electrode and a driving portion, in addition to the leading electrode for taking out a voltage at the center portion of the generator portion in a Roazen type piezoelectric transformer.

Then, a voltage generated between the central leading electrode and the grounding electrode is taken out through these electrodes to form an external terminal at the generator portion side as a two terminal structure constituted of mutually isolated two terminals. By this, two external terminals at the driving portion side and the two external terminals at the generator portion side are completely isolated from each other. Thus, the piezoelectric transformer having a four terminal structure can be realized.

Mounting of the external terminal to the grounding electrode is performed on the electrode which extends from a strip portion of the grounding electrode toward the end face in T-shaped configuration and at a position shifted from the end face of the transformer in the extent of ¼ wavelength of longitudinal vibration tertiary mode in length. This position corresponds to the node of tertiary mode longitudinal vibration.

Accordingly, by driving the shown embodiment of the piezoelectric transformer at a resonance frequency of longitudinal vibration tertiary mode in length, the positions of all junctions of external terminals corresponding to respective electrodes of the driving portion and the generator portion can be matched with the nodes of vibration.

On the other hand, in the generator portion, the electrode located at the position between the electrode at the center of the generator portion and the electrode of the driving portion are formed in advance of polarization in the length direction and the thickness direction. On the other hand, for the electrode having the leg portion projectingly extended into T-shaped configuration toward the end of the transformer from the strip portion, a timing to perform the formation process is determined depending upon a distance between the electrode in question and the electrode of the driving portion.

Namely, when the distance between the electrodes is longer than an isolation distance of the electric field to be applied upon polarization in the thickness direction, formation of the T-shaped electrode is performed in advance of polarization, and otherwise, the formation is performed after polarization.

If the distance between the electrodes is longer than the isolation distance and possibility of occurrence of discharging upon polarization in the thickness direction is low, it becomes possible to decrease cost of the electrode construction in the shown embodiment by forming the T-shaped electrode simultaneously with formation of other electrodes. On the other hand, when the distance between the electrodes is short and thus the possibility of occurrence of discharge is high, lowering of yield in manufacturing of the piezoelectric transformer due to occurrence of discharge can be avoided by forming the T-shaped electrode after polarization. In such case, when the T-shaped electrode is formed at a temperature lower than Curie point (Curie temperature) of the piezoelectric ceramic material, degradation of polarized condition may not be caused.

Hereinafter, concrete discussion will be given with reference to the drawings.

Referring to FIG. 1, the shown embodiment of the piezoelectric transformer includes two driving portions 11a and 11b arranged at both ends in the longitudinal direction and the generator portion 12 located between two driving portions.

The driving portion 11a has a construction, in which a piezoelectric ceramic plate 111 (114 in case of the driving portion 11b) is sandwiched between upper and lower electrodes 112, 113 (115, 116 in case of the driving portion 11b). In the driving portions 11a and 11b located at both ends of the transformer, the piezoelectric ceramic plates 111 and 114 are polarized in the thickness direction in the equal orientation as shown by arrows Ya and Yb in FIG. 2A. Accordingly, in the shown embodiment, by connecting the electrodes 112 and 115 and the electrodes 113 and 116, the piezoelectric ceramic plates 111 and 114 of two driving portions are driven to vibrate in equal phase.

Next, reference is made to FIG. 2A. The generator portion 12 is constructed with the following three kinds of portions:

(1) Central Portion Electrode

This is a portion located at the central position of the generating portion, in which a strip form leading electrode 123 is formed surrounding the transformer;

(2) Voltage Generating Portion

This is a portion located at both sides of the central electrode portion, in which piezoelectric ceramic plates 121 and 122 are polarized in the longitudinal direction as shown by arrows Yc and Yd, wherein the orientations of polarization are mutually opposite across the electrode 123 at the central portion;

(3) Grounding Electrodes;

These are electrodes 124 and 125 located between the voltage generating portions and both driving portions 11a and 11b and having strip portions extending to surround the transformer and leg portions extending from the strip portion on the side surface of the transformer toward the longitudinal end to form T-shaped configuration in plan view;

In FIG. 3A, there is diagrammatically illustrated electrical circuit connection of the shown embodiment of the piezoelectric transformer. In FIG. 3A, for driving the shown piezoelectric transformer, the following terminals for external connection (external terminals) are connected to respective electrodes.

(1) The upper electrode 112 of the left side driving portion 11a and the upper electrode 115 of the right side driving portion 11b are connected to an external electrode 311 to have equal potential.

(2) The lower electrode 113 of the left side driving portion 11a and the lower electrode 116 of the right side driving portion 11b are connected to an external terminal 312 to have equal potential.

(3) The electrode 123 at the center of the generator portion is connected to an external terminal 321.

(4) The left side grounding electrode 124 and the right side grounding electrode 125 are connected to an external terminal 322 to become equal to each other. In this case, the soldering operation may be facilitated by making the widths of the electrodes at the junctions 111a, 112a, 122a, 121b, 113c, 114c and 123c greater than that in other portions.

By establishing connections as set forth above, a pair of external terminals 311 and 312 at the driving portion side and a pair of external terminals 321 and 322 are isolated from each other.

In the construction set forth above, when an alternating input voltage is applied between the external terminals 311 and 312 at the side of the driving portion of the transformer, a high output voltage can be obtained between the external terminals 321 and 322 of the generator portion. Now, when an alternating voltage is applied between the external terminals 311 and 312, the alternating voltage applies electric fields of mutually equal phase to the piezoelectric ceramic plates of two driving portions via electrodes 112, 113 and 115, 116. Therefore, longitudinal vibration is generated in piezoelectric transverse effect 31 modes via electromechanical coupling coefficient k31. The longitudinal vibration is transmitted to the generator portion 12. As a result, a voltage is generated between the central electrode portion 123 and the strip electrodes 124 and 125 of the grounding electrode portions in piezoelectric longitudinal effect 33 mode via an electromechanical coupling coefficient k33. The generated voltage is externally taken out from the portion between the external terminals 321 and 322.

At this time, when the frequency of the alternating input voltage to be applied to the driving portion 11a and 11b is set to be equal to the resonance frequency of the longitudinal vibration in the length of the transformer, a high output voltage can be obtained. It should be noted that when high voltage is input and low voltage is taken out through voltage drop, the alternating input voltage is applied to the generator portion 12 by taking the external terminals 321 and 322 of the generator portion side as input terminals, and output voltage is taken out from the driving portion by taking the external terminals 311 and 312 of the driving portion side as output terminals. This is similar to the case of the conventional piezoelectric transformer.

Next, discussion will be given for the mounting position of the external terminals 311, 312, 321 and 322 to respective electrodes in the piezoelectric transformer. FIGS. 3B and 3C are sections as sectioned along cut lines extending in the width direction in parallel relationship to each other at the positions shown by A—A and B—B of FIG. 3A and are diagrammatical section showing connecting condition between respective external terminals and respective electrodes. It should be noted that the positions A—A and B—B of FIG. 3A are positions shifted from the longitudinal both ends of the transformer in the extent corresponding to ¼ and ¾ wavelength of longitudinal vibration tertiary mode in length.

With reference to FIGS. 3A, 3B and 3C, the external terminal 311 of the driving portion is connected to the electrode 112 of the driving portion in case of the driving portion 11a (115 in case of the driving portion 11b) at a junction 111a on the upper surface of the transformer in case of the driving portion 11a (113c in case of the driving portion 11b). Another external terminal 312 of the driving portion is connected to the electrode 113 in case of the driving portion 11a (116 in case of the driving portion 11b) at a junction 112a in case of the driving portion 11a (114c in case of the driving portion 11b) on the lower surface of the transformer.

On the other hand, the external terminal 322 of the generator portion is connected to the grounding electrode 124 at a junction 112a on the side surface of the transformer and to the grounding electrode 125 at a junction 123c on the side of the transformer. Another external terminal 321 of the generator portion is connected to the electrode 123 at the center portion at a junction 121b.

Here, FIG. 3D illustrates distribution of displacement when the transformer constructed as set forth above is driven in longitudinal vibration tertiary mode. This is the vibration mode, in which 3/2 of longitudinal vibration is equal to the entire length of the piezoelectric transformer. As shown in FIG. 3D, there are three nodes of vibration N1, N2 and N3 and four peaks of vibration L1, L2, L3 and L4. The nodes N1 and N3 are located at positions respectively offsetting for ¼ wavelength from both ends of the transformer, and the node N2 is located at the center of the entire length of the transformer.

Comparing the positions of the nodes and respective junctions with reference to FIGS. 3A and 3D, it should be appreciated that the junctions 111a, 122a and 112a are arranged at the node N1, the junctions 113c, 114c and 123c are arranged at the node N3, and the junction 121b is arranged at the node N2. Thus, in the shown embodiment of the piezoelectric transformer, all of the external terminals can be taken out from the nodes of vibration. Therefore, both good vibration characteristics and high reliability of connection can be realized.

On the other hand, in the shown embodiment of the piezoelectric transformer, the center electrode 123 of the generator portion and the strip portions of the grounding electrodes 124, 125 are arranged to surround the circumference of the transformer. Therefore, distortion becomes smaller than that in the case where the electrodes are arranged only on the upper and lower surfaces and thus becomes substantially parallel to the length direction. Accordingly, polarization of the piezoelectric ceramic plates 121 and 122 in the generator portion can be aligned in the length direction to permit rising of the electromechanical coupling coefficient k33 until the limit of the material.

It should be noted that, in the shown embodiment, while the leg portion of the T-shaped electrode is formed on the side surface of the transformer, it is not essential to form it on the side surface. On the other hand, while the leg portions of the T-shaped electrode of the electrode 123 are located at left and right sides of the center portion, it is not inherent to locate them at the same surfaces at left and right sides. FIG. 4A shows a side elevation of the transformer, in which leg portions of the left and right T-shaped electrode are not formed at the same side surfaces. FIGS. 4B, 4C and 4D are sections sectioned along cut-lines extending in the width direction at positions of A—A, B—B and C—C of FIG. 4A. As discussed later, the external terminals are mounted at the portions of the legs of the T-shaped electrodes.

In the piezoelectric transformer of the construction of FIG. 4A, among the leg portions of the T-shaped electrode at left and right sides in the length direction, one is positioned at the left side in the width direction (FIG. 4B) and the other is present at the right side (FIG. 4D). Therefore, each external terminal is taken out from each of left and right sides.

It should be noted that, in FIGS. 4A to 4D, like components to FIGS. 1 to 3D would be identified by like reference numerals.

While the leg portions of the T-shaped electrode of the grounding electrode at the generator portion in the foregoing embodiment are provided at the side surfaces of the transformer, it is not inherent to provide the leg portions on the side surfaces. The second embodiment of the piezoelectric transformer is described having the leg portion of the T-shaped electrode on the major surface perpendicular to the thickness direction of the traducer.

Figure 5A:
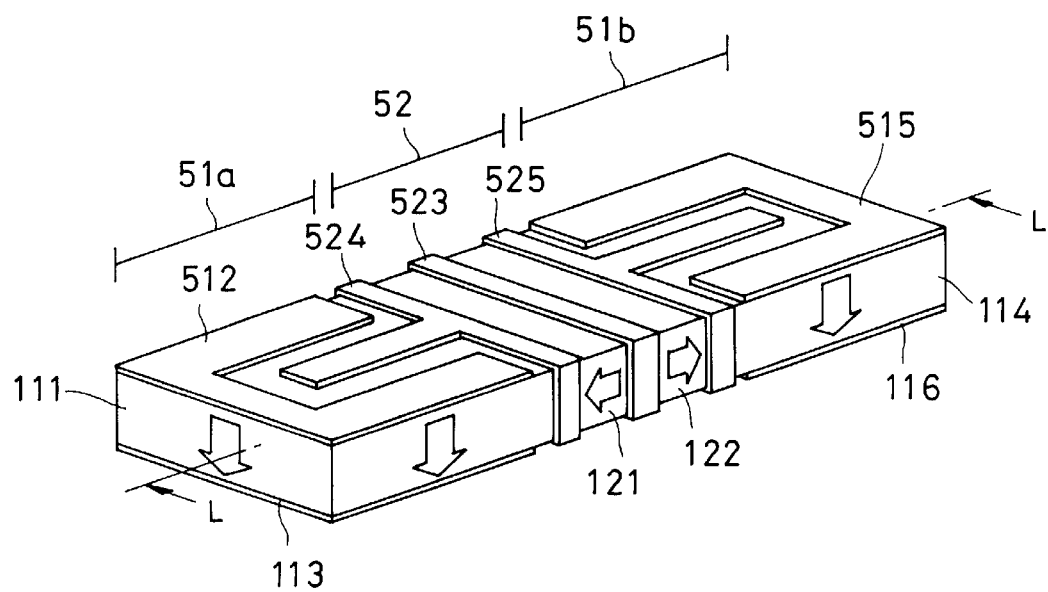
FIG. 5A is a perspective view showing a construction of the second embodiment of a piezoelectric transformer according to the present invention.
Figure 5B:
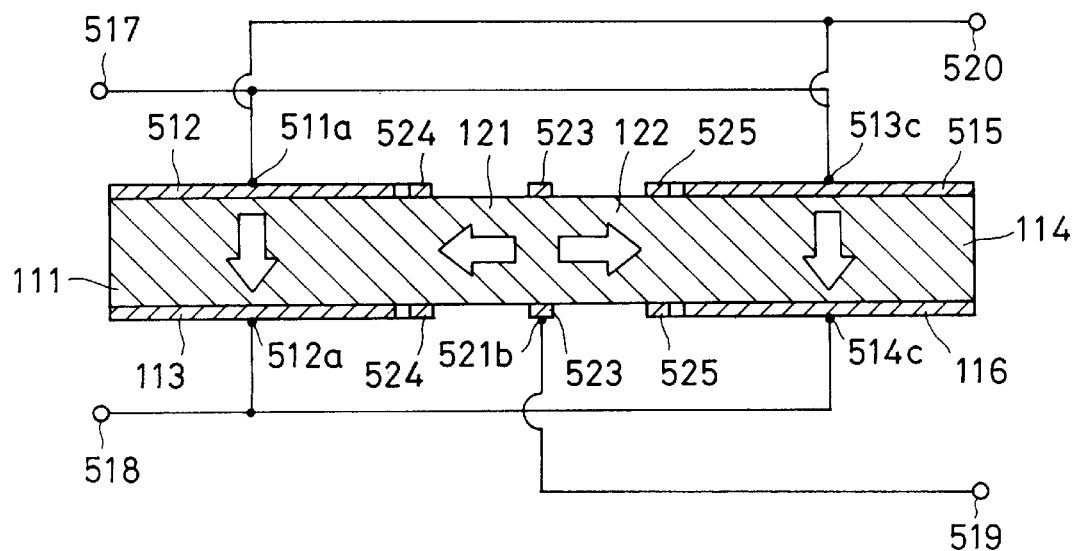
FIG. 5B is a section of the piezoelectric transformer of FIG. 5A and diagrammatic illustration showing connecting condition to an external terminal.
Figure 6A:
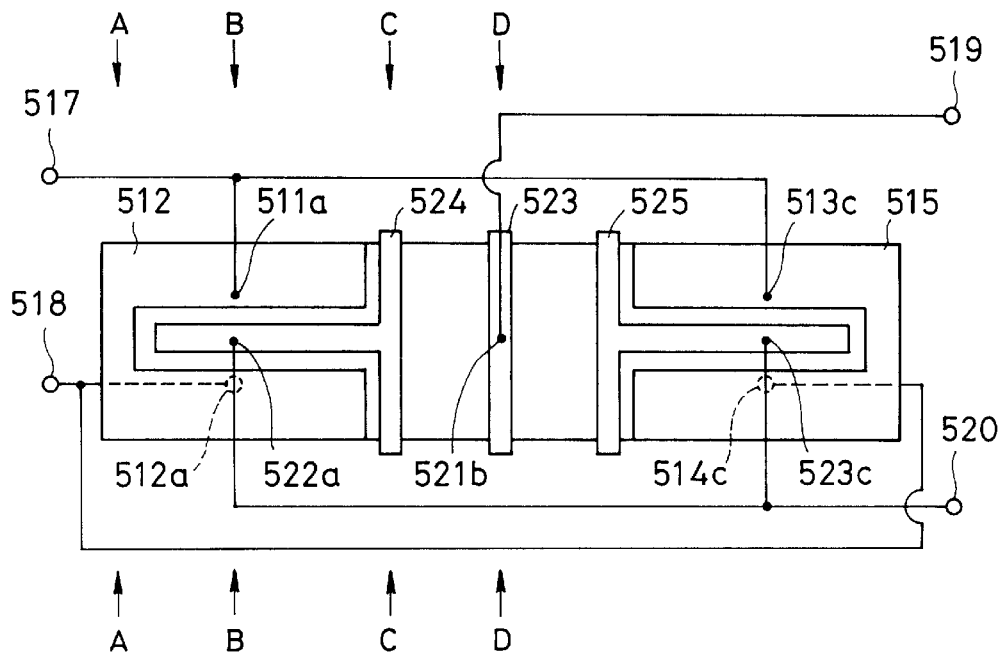
FIG. 6A is a plan view of the transformer of FIG. 5A as viewed from the upper surface.

FIG. 5A is a perspective view of the shown embodiment of the transformer. Like components to those in FIGS. 1 to 4D will be identified by like reference numerals. FIG. 5B is a section as taken along line L—L in the longitudinal direction of the shown embodiment of the transformer. FIG. 6A is a plan view of the transformer of FIG. 5A as viewed from the above.

On the other hand, in FIGS. 7A, 7B, 7C and 7D, sections sectioned along cut lines located at positions at A—A, B—B, C—C and D—D of FIG. 6A. Like components to those in FIGS. 1 to 4D will be identified by like reference numerals. Referring to FIGS. 5A to 7D, the shown embodiment of the piezoelectric transformer is differentiated from the transformers of FIGS. 1 to 4D in the following points.

(1) In addition to the leg portions of the T-shaped electrodes 524 and 525 of the grounding electrode of the generator portion 52 formed on the upper surface of the transformer, electrodes 512 and 515 of the driving portions 51a and 51b are formed into a U-shaped configuration surrounding the leg portions (see FIG. 5A).

Figure 7A:
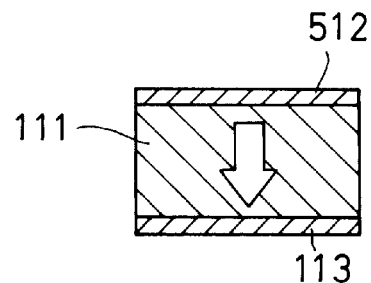
FIGS. 7A to 7D are sections in respective portions of the piezoelectric transformer of FIG. 6A.
Figure 7B:
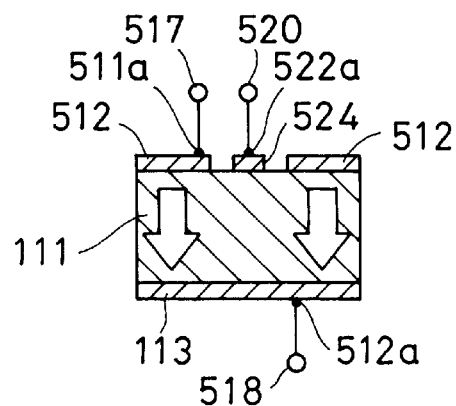
Figure 7C:
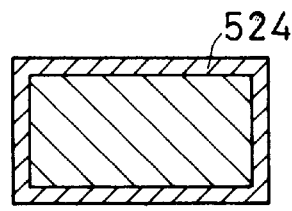
Figure 7D:
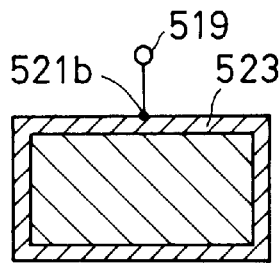

(2) As shown by the arrow representing polarization in FIG. 7B, only portions where the U-shaped electrodes are provided on the upper surfaces of the driving portions 51a and 51b, are polarized. Namely, portions out of the U-shaped electrodes are piezoelectrically inactive portions.

(3) With reference to FIG. 7B, the external terminals 517 and 518 of the driving portions 51a and 51b are connected to point symmetric positions with respect to the center of the section at upper and lower major surfaces of the transformer. One external terminal 518 is connected to the center electrode 523 at a junction 521b, and the other external terminal 520 is connected to the leg portions of the T-shaped grounding electrodes 524 and 525 located within the driving portions at junctions 522a and 523c.

Figure 6B:
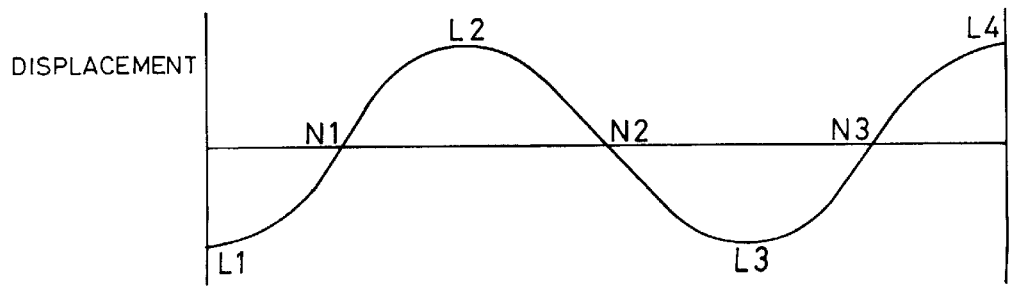
FIG. 6B is an illustration showing a distribution of displacement in the longitudinal direction in the longitudinal vibration tertiary mode in the length of the piezoelectric transformer.

With reference to the distribution of displacement as driven at a tertiary mode of longitudinal vibration in length shown in FIG. 6B, the junctions 511a, 512a and 522a correspond to the node N1, the junction 521b corresponds to the node N2, and the junctions 513c, 514c and 523c correspond to the node N3, respectively.

By this, in comparison with the first embodiment of the transformer, in the shown embodiment, while efficiency is lowered for reduction of the piezoelectrically active portion, the external terminal can be taken out only from the upper and lower major surfaces of the transformer without interfering vibration. Therefore, when electrical connection also serving as support is established, support can be facilitated in comparison with the transformer of FIGS. 1 to 4D where the external terminals are provided both on the side surface and major surface.

Figure 8:
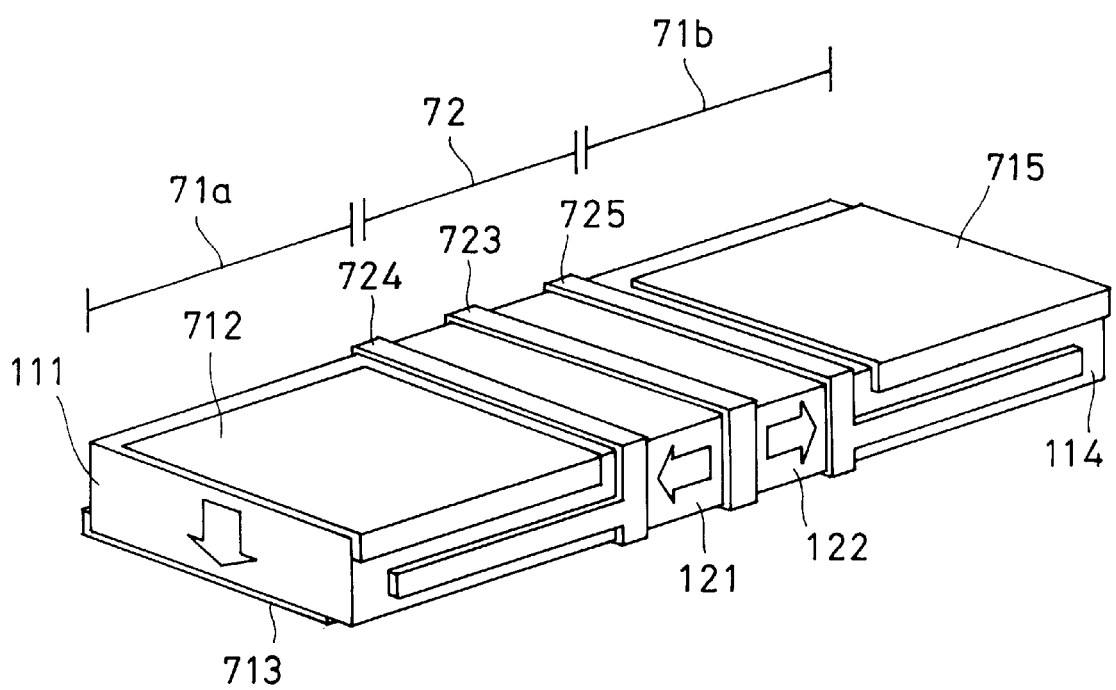
FIG. 8 is a perspective view showing a construction of the third embodiment of a piezoelectric transformer according to the invention.
Figure 9A:
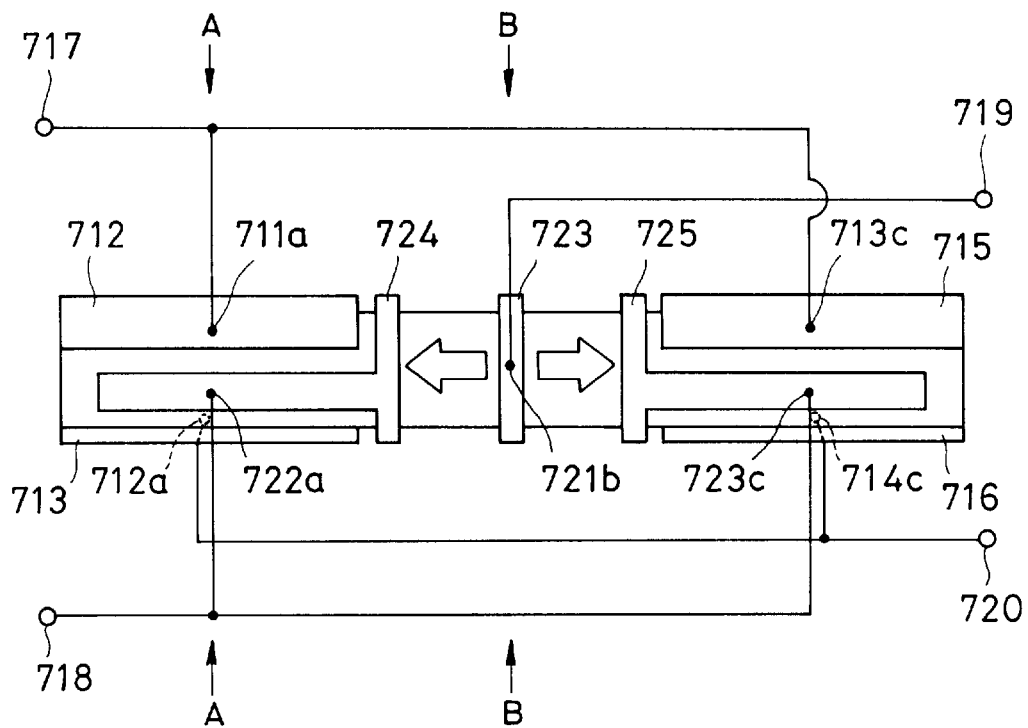
FIG. 9A is a diagrammatic illustration showing an electrical circuit connection of the piezoelectric transformer of FIG. 8.
Figure 9B:
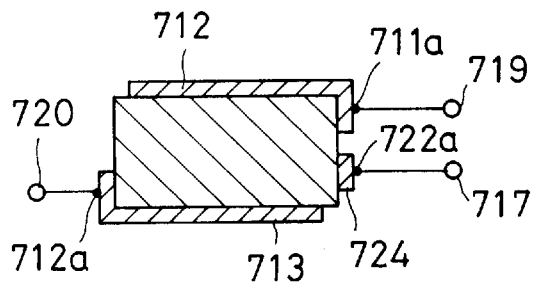
FIGS. 9B and 9C are sections of respective portions in FIG. 9A.
Figure 9C:
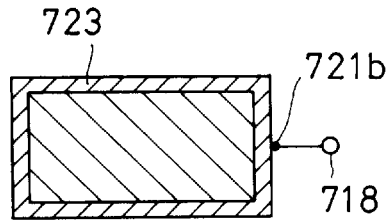

Next, discussion will be given for the third embodiment of the transformer having a construction for taking out all of the external terminals only from the side surfaces of the transformer. FIG. 8 is a perspective view of the third embodiment of the transformer and FIG. 9A shows side elevation. Like components to those in FIGS. 1 to 7D will be identified by like reference numerals. FIGS. 9B and 9C are sections sectioned at cut lines in the width direction positioned at A—A and B—B. The features of the shown embodiment of the transformer are as follows:

(1) Upper and lower electrodes 712 and 713 of the driving portion 71a (715 and 716 in case of the driving portion 71b) extend from the upper and lower major surfaces to the side surfaces of the transformer, and have L-shaped sections. It should be noted that upper and lower electrodes 712 and 713 (715 and 716 in case of the driving portion 71b) are formed at positions shifted toward inside from the ends of the transformer (application margins are present) for providing longer distance between the electrodes in view of avoidance of discharge during the polarization process in the thickness direction.

(2) The external terminals 717 and 718 of the driving portions are respectively connected to junctions 711a, 713c and 712c, 714c on both left and right side surfaces of the transformer (see FIG. 9A). One external terminal 718 of the generator portion 72 is connected to the junction 721b of the side surface of the transformer of the electrode 723 at the center portion, and the other external terminal 720 is connected at the junctions 722a and 723c of the T-shaped electrodes 724 and 725 provided at the side surfaces of the transformer.

Accordingly, since taking out of all of the external terminals can be done from the side surfaces, similarly to the embodiment of FIGS. 5A to 6B, support in conjunction with electrical connection is facilitated. On the other hand, while the shown embodiment forms the grounding electrodes of the generator portion on the same side surfaces, no problem will arise even when the grounding electrodes are not formed at the same surfaces at left and right sides as shown in FIGS. 4A to 4D.

It should be noted that while the foregoing discussion has been made under the premise of the Roazen type piezoelectric transformer employing the piezoelectric transverse effect 31 mode and the piezoelectric longitudinal effect 33 mode, the present invention is equally applicable for other types of piezoelectric transformers.

Figure 10A:
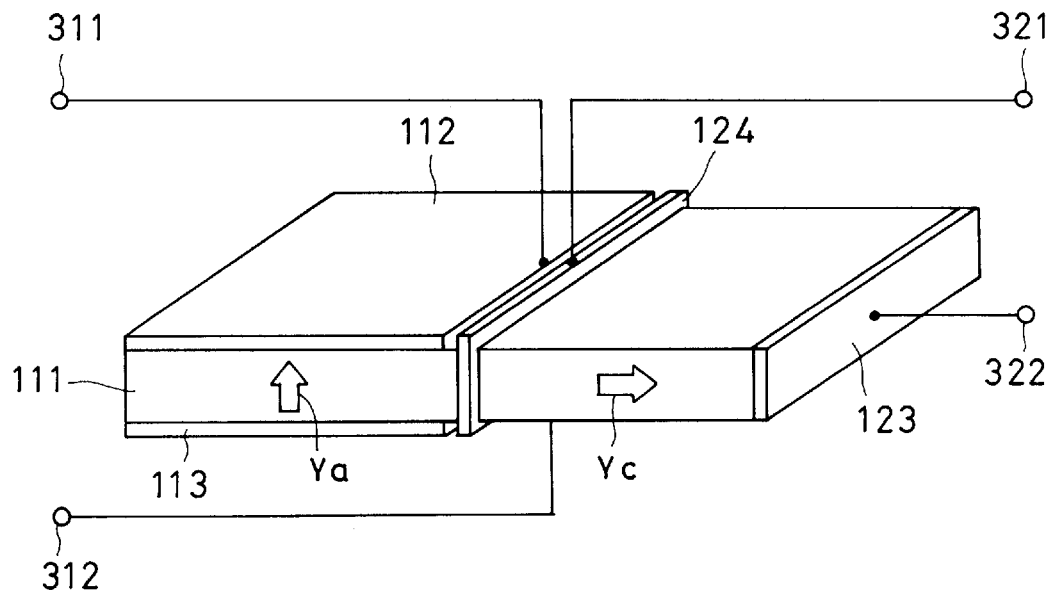
FIGS. 10A and 10B are perspective views showing constructions in the case where the present invention is applied to another type of piezoelectric transformer.

For example, as shown in FIG. 10A, a piezoelectric transformer comprises electrodes 112 and 113 provided at the half area of both major surfaces of the piezoelectric ceramic plate 111, the strip-shaped electrode 124 provided at the center portion surrounding the circumference of the transformer, and the electrode 123 provided at the end portion of the piezoelectric ceramic plate 111. In such a transformer, by inputting alternating voltage between terminals 311 and 312, the output voltage is obtained between the terminals 321 and 322. In this transformer, four terminals are electrically isolated to obtain good electrical characteristics.

It should be noted that depending upon the modes to be used, the junctions of respective terminals may be set at appropriate positions.

Figure 10B:
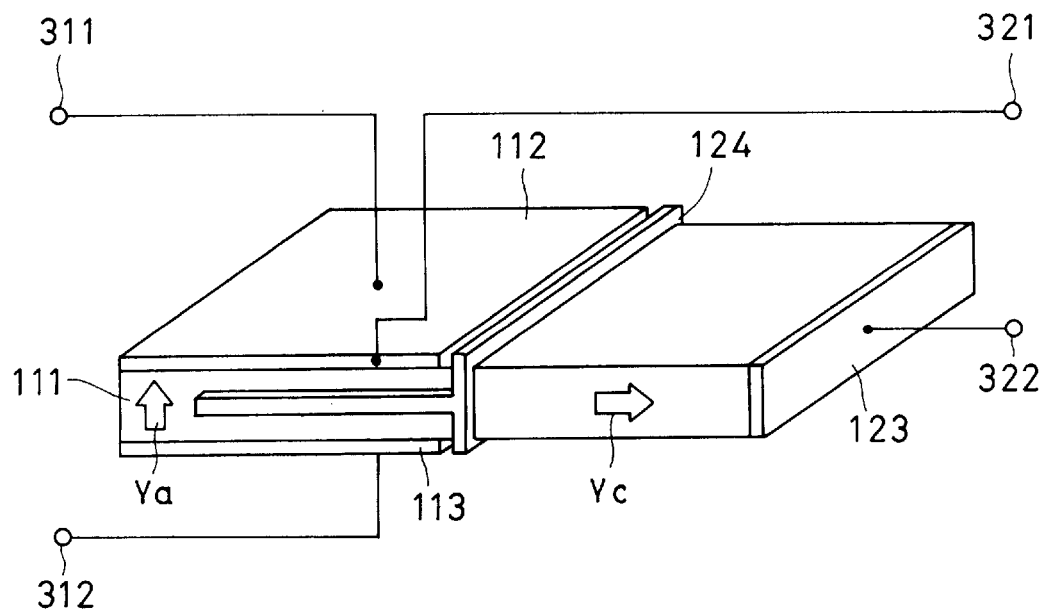

On the other hand, as shown in FIG. 10B, a piezoelectric transformer comprises electrodes 112 and 113 provided at the half area of both major surfaces of the piezoelectric ceramic plate 111, the T-shaped electrode 124 constituted of the strip portion surrounding the circumference of the transformer and the leg portion extending on the side surface of the transformer toward the end portion of the transformer, provided at the center portion surrounding the circumference of the transformer, and the electrode 123 provided at the end portion of the piezoelectric ceramic plate 111. Such a transformer may operate similarly. The junctions of respective terminals may be set at appropriate positions depending upon the modes to be used.

It should be noted that in FIGS. 10A and 10B, like components to those in FIGS. 1 to 4D will be identified by like reference numerals.

It is also possible to employ a disc shaped piezoelectric ceramic plate instead of the elongated plate form. For example, FIG. 11A is a plan view of the piezoelectric transformer employing a disc-shaped piezoelectric ceramic plate, and FIG. 11B is a section taken along line L—L of FIG. 11A.

Figure 11A:
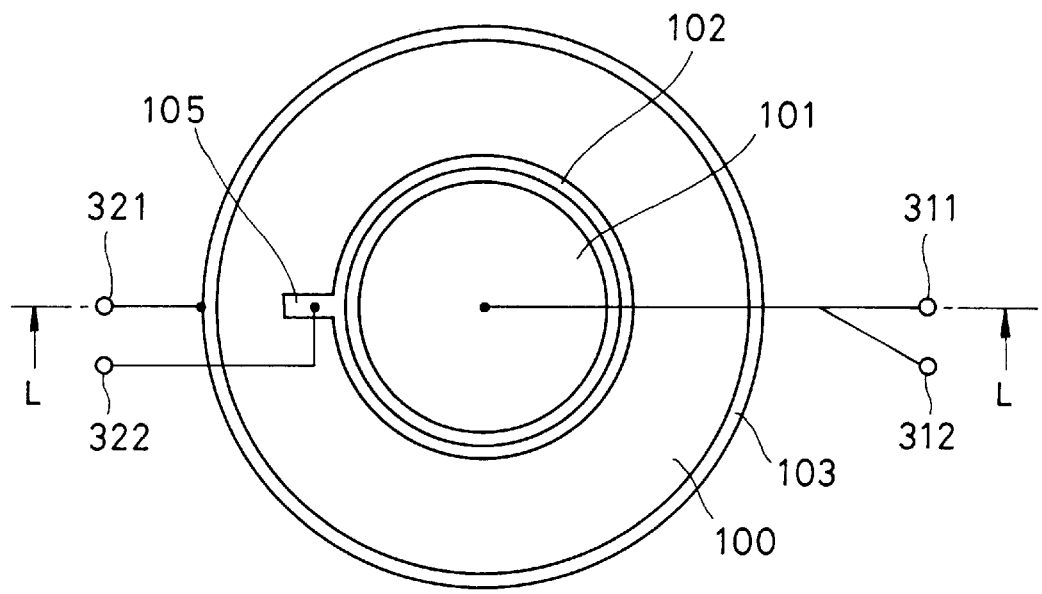
FIG. 11A is a plan view showing a construction, in which the present invention is applied for a disc-shaped piezoelectric transformer.
Figure 11B:
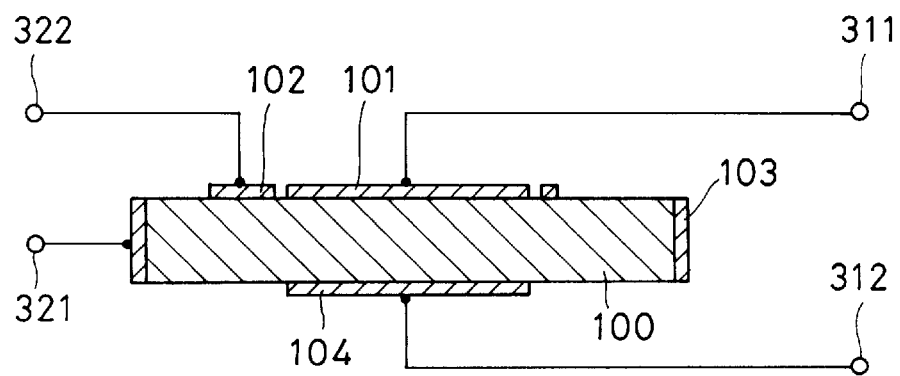
FIG. 11B is a section of the piezoelectric transformer of FIG. 11A.

With reference to FIGS. 11A and 11B, circular electrodes 101 and 104 are provided at the center portion on both major surfaces of disc-shaped piezoelectric ceramic plate 100. Then, on the circumference of the piezoelectric ceramic plate 100, namely on the side surface thereof, an electrode 103 is provided. Also, surrounding the electrode 101 provided on one major surface of the piezoelectric ceramic plate 100, a ring-shaped electrode 102 is provided across an isolation distance On the electrode 102, as shown in the drawing, a projecting portion 105 corresponding to the leg portion of the T-shaped electrode shown in FIG. 1 and so forth.

When the alternating voltage is applied between the terminals 311 and 312, the output voltage is obtained between the terminals 321 and 322. In such a transformer, four terminals are electrically isolated from each other to provide good electric characteristics. Such transformer operates to radially propagate vibration from the center portion to the circumferential portion. Therefore, the junctions of respective terminals may be set at appropriate positions depending upon the modes to be used.

It should be noted that, even in FIGS. 11A and 11B, like components to those in FIGS. 1 to 4D will be identified by like reference numerals.

The foregoing first to third embodiments of the piezoelectric transformers are produced through the following process.

At first, as a material of piezoelectric ceramic, a sintered body of NEPEC8 (tradename: available from Tokin Corporation in Japan) which is PZT ($Pb(Zr_x \cdot Ti_{1-x})O_3$) type piezoelectric ceramic is employed. The sintered body is cut into the required configuration to form into the elongated plate form. The transformers in the foregoing first to third embodiments are cut to have external dimensions of 42.00 mm in length, 10 mm in width and 1 mm in thickness.

Next, an electrode is formed. In the process of formation of the electrode, a paste of Ag 100% is used to form a pattern by way of ordinary thick film screen printing method and baked at 600° C. Concerning the piezoelectric transformer of the first embodiment, in order to study discharge during polarization in the thickness direction at a distance between the leg portion of the T-shaped grounding electrode 124 provided on the side surface in case of the driving portion 11*a* (the leg portion of the T-shaped grounding electrode 125 in case of the driving portion 11*b*), and the electrodes 112, 113 in case of the driving portion 11*a* (the electrodes 115, 116 in case of the driving portion 11*b*) of the driving portion provided on upper and lower major surfaces, the electrodes are printed with various widths of the leg portions of the T-shaped electrodes 124 and 125.

Here, concerning formation of the electrode, it is not essential to form the electrodes by the thick film screen printing method, but can be any appropriate process, such as vapor deposition method, sputtering method and so forth. Also, the paste is not required to be Ag but can be of any appropriate materials which can be sintered.

Subsequently, the temperature is elevated up to the Curie point (340° C.) of the used piezoelectric material. Upon lowering of the temperature down to the normal temperature, 3.5 kV of electric field is applied in the length direction to perform are polarization process. Polarization in the thickness direction is performed by applying 2 kV of electric field within 150° C. of silicon type insulative oil.

At this time, when the distance between the leg portion of the T-shaped electrode 124 (or leg portion of the electrode 125) and the electrodes 112 and 113 of the driving portion (or 115, 116) is 0.3 mm, discharge has been caused in the probability of 20%. On the other hand, when the distance between the electrodes is 0.1 mm, discharge has been caused in the probability of 80%. In the shown embodiment, since the thickness of the transformer is 1 mm, even when 0.3 mm of electrode width at minimum is reserved as required for soldering as set out later, at the leg portions of the T-shaped electrodes 124 and 125, the distance between the electrodes becomes greater than or equal to 0.3 mm. Therefore, probability of occurrence of discharge during polarization becomes quite low. However, when a transformer is formed with a thickness of 0.8 mm, the distance between the electrodes becomes less than or equal to 0.3 mm to elevate the probability of occurrence discharge to 50%.

On the other hand, while the polarization in the thickness direction was performed under the condition set forth above, the distance between the electrodes to cause discharge may be varied according to variation of the condition, such as to perform polarization in the air instead of oil, to vary the intensity of the electric field to be applied, and so forth. Therefore, it becomes necessary to profound the distance between the electrodes which possibly causes discharge depending upon conditions (kind of medium, temperature of the medium, intensity of the electric field and so forth) upon polarization as well as dimension of the transformer.

When a safety distance (isolation distance) at which discharge may not be caused as determined depending upon the dimension of the transformer and polarization condition can not obtained, the electrodes 112, 113, 115 and 116 of the driving portion, the center electrode 123 and strip portion of the grounding electrodes 124, 125 are formed before polarization and the leg portions of the T-shaped electrodes 124 and 125 of the generator portion are formed after polarization to form the transformer. At this time, formation of the leg portions of the T-shaped electrodes are performed at a temperature lower than or equal to the Curie point. If the process temperature exceeds the Curie point, polarization in the length direction and thickness direction are canceled.

Therefore, in formation of electrodes, it is difficult to use the conductive paste (as set forth, 600° C. in case of Ag) as that in other electrodes. In the shown embodiment, the leg portions are formed with a setting type conductive paste (setting temperature is 140° C.) which can be soldered, by way of thick film screen printing method. Then, no abnormality in transformer operation has been experienced. Needless to say, normal operation can be attained even when the leg portions are formed by jet printing method or so forth. Also, when the safety distance (isolation distance) between the electrodes can be certainly provided, all of the electrode may be formed simultaneously before the polarization process. Clearly, this process is much less expensive in comparison with the former process.

As set forth above, after the polarization process, conductors are soldered to respective electrodes. The positions to solder the conductors are as illustrated in FIGS. 3A to 3D, 6A, 6B and 8. As set forth above, since the length of all of the transformers of the first to third embodiments is 42 mm, the nodes upon driving in longitudinal tertiary mode in length are located at positions inwardly shifted by 7 mm from both ends of the transformer and at the center, i.e. 21 mm each from each ends of the transformer.

Therefore, as shown in FIG. 4A in the first embodiment, the junctions 111*a*, 112*a*, 122*a* and 113*c*, 114*c*, 123*c* are located at positions inwardly shifted from both ends of the transformer for 7 mm and the junction 121*b* is located at the position shifted for 21 mm from either end of the transformer. Similarly, in the second embodiment, as shown in FIG. 6A, the junctions 511*a*, 512*a*, 522*a*, and 513*c*, 514*c*, 523*c* are located at positions inwardly shifted from both ends of the transformer by 7 mm and the junction 521*b* is located at the position 21 mm from either end of the transformer. Also, in the third embodiment, as shown in FIGS. 9A to 9C, the junctions 711*a*, 712*a*, 722*a*, and 713*c*, 714*c*, 723*c* are located at positions inwardly shifted from both ends of the transformer by 7 mm and the junction 721*b* is located at the position 21 mm from either ends of the transformer.

Next, discussion will be given for a driving method of the piezoelectric transformer according to the present invention.

Figure 12:
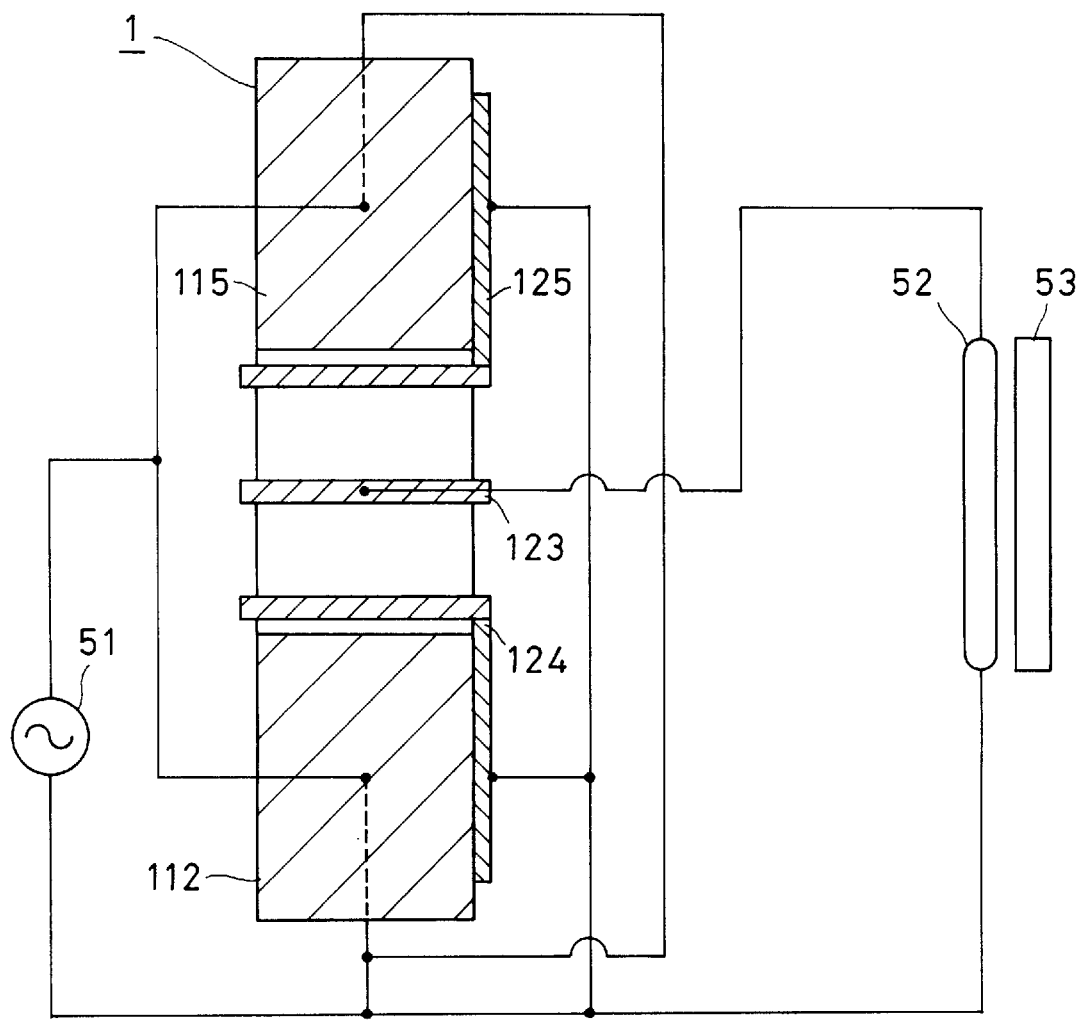
FIG. 12 is an illustration showing a driving method of the first embodiment of the piezoelectric transformer of the present invention.
Figure 13:
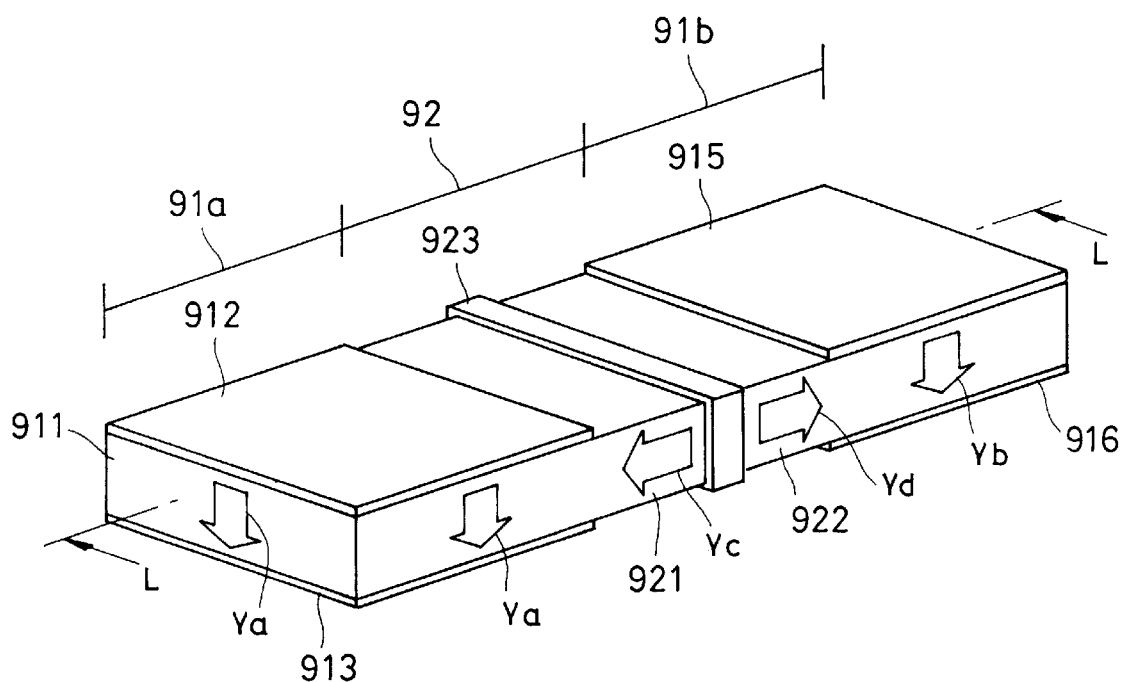
FIG. 13 is a perspective view showing a construction of the conventional piezoelectric transformer.
Figure 14A:
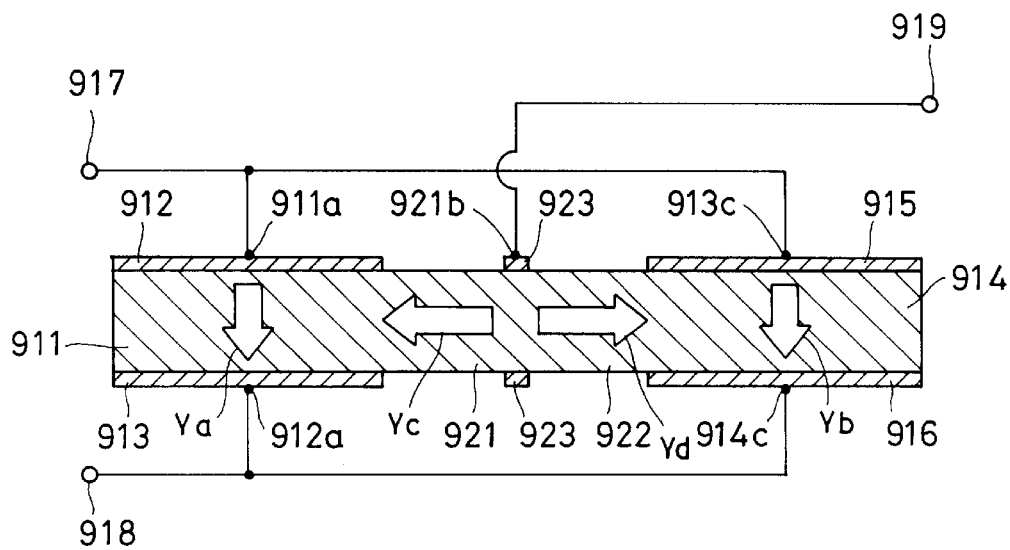
FIG. 14A is a section of the piezoelectric transformer of FIG. 13 and diagrammatic illustration showing a connecting condition with the external terminal.
Figure 14B:
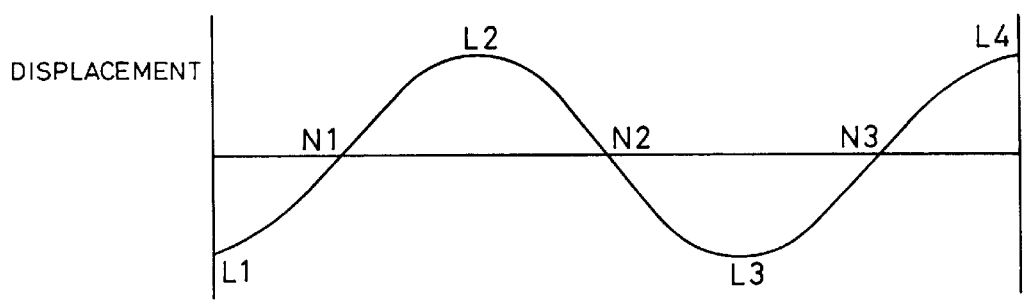
FIG. 14B is a chart showing distribution of displacement in the longitudinal direction in the longitudinal vibration tertiary mode in the length of the piezoelectric transformer of FIG. 13.

FIG. 12 is a circuit diagram showing a condition where the first embodiment of the piezoelectric transformer is connected to a load. In the shown embodiment, a cold-cathode tube 52 which is 220 mm in length and 3φ in diameter, is employed as the load. In the cold-cathode tube 52, a reflector panel 53 of aluminum are connected in parallel.

In such a construction, an alternating voltage having a frequency equal to the resonance frequency of longitudinal vibration tertiary mode in length of the piezoelectric is supplied from a driving power source 51. As set forth above, the resonance frequency of longitudinal vibration tertiary mode in length of the transformer in the first to third embodiments is measured as 110 kHz from input/output frequency characteristics of the transformer.

In the first embodiment of the piezoelectric transformer, when the alternating voltage of 26 Vrms (root mean square) is applied as input voltage, 550 Vrms of output voltage is obtained. Then, the output power was 3 W. On the other hand, a hundred of these piezoelectric transformers were driven for 200 hours. As a result, no element which causes exfoliation of external electrode, breakage of the conductor or abnormality of characteristics has been observed.

Also, the second embodiment of the piezoelectric transformer was also prepared and put into operation by connecting the same load to the former example. With respect to the input voltage of 26 Vrms, 370 Vrms of output voltage and 1.4 W of output power was obtained.

In the third embodiment of the piezoelectric transformer, with respect to the input voltage of 26 Vrms, 510 Vrms of output voltage and 2.6 W of output power was obtained.

As set forth above, the shown embodiments of the piezoelectric transformer have two voltage taking out portions arranged in parallel in the length direction, in the generator portion. In these two kinds of voltage taking out portions, since the electrodes are provided independently of each other, the voltage generated between the voltage taking output portions can be taken out from between these electrodes. Thus, four terminals including two external terminals of the driving portion side and two terminals of the generator portion can be completely isolated from each other.

On the other hand, in the voltage taking out portion, the electrode of the voltage taking out portion is extended from the center side in the length direction to the end face side to project to establish connection with the external terminal and the electrode at the position inwardly shifted in the extent of ¼ wavelength of the longitudinal vibration tertiary mode in length, from the end of the transformer. This position corresponds to the position of the node in the tertiary mode longitudinal vibration.

Therefore, by driving the shown embodiment of the piezoelectric transformer at the resonance frequency in the longitudinal vibration tertiary mode, positions of junctions between the external terminals and respective electrode of the driving portion and the generator portion are matched with the nodes of vibration to maintain high mechanical strength.

Furthermore, when a distance between the projecting portion of the generator portion of the shown embodiment of the transformer to the electrode of the driving portion is short and thus can cause discharge, the projecting portion is formed after the polarization process, at the temperature lower than or equal to the Curie point. By this, discharge can be avoided to prevent lowering of yield.

As set forth above, the present invention can enhance reliability of the transformer by realizing a piezoelectric transformer which has a construction capable of completely isolating respective input and output terminals. Also, by the manufacturing method, in which timing of formation of the electrode is determined depending upon the isolation distance, a manufacturing process of the transformer achieving high yield can be realized.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the features set out in the appended claims.

What is claimed is:

1. A piezoelectric transformer at a resonance frequency in a longitudinal vibration tertiary mode, comprising:

a piezoelectric body in a polarized condition;

input electrodes provided on a surface of said piezoelectric body and applied with an alternating voltage of a frequency depending upon the resonance frequency of the piezoelectric body, said input electrodes having a portion being positioned at a node of vibration of said piezoelectric body;

a leading electrode provided on the surface of said piezoelectric body, said leading electrode taking out a voltage depending upon a vibration of said piezoelectric body; and a grounding electrode extending around said piezoelectric body at a position of peak vibration of said piezoelectric body, said grounding electrode further having a portion on a side surface of said piezoelectric body extending to said node of vibration of said piezoelectric body, said grounding electrode further being electrically isolated from said input electrodes, an output voltage is taken-out between said leading electrode and said grounding electrode, and positions of junctions between external terminals and respective electrodes are matched with the node of vibration of said piezoelectric body.

2. A piezoelectric transformer as set forth in claim 1, wherein a position of applying alternating voltage to said input electrodes and a position to take-out the output voltage from said leading electrode and said grounding electrode are located at the node of vibration of said piezoelectric body.

3. A piezoelectric transformer at a resonance frequency in a longitudinal vibration tertiary mode, comprising:

a piezoelectric body having a plate-shape and having a length corresponding to $3/2$ of a wavelength corresponding to the resonance frequency;

first and second driving portions provided at one primary surface and a second primary surface at both ends in a length direction of said piezoelectric body and having input electrodes, said input electrodes having a portion being positioned at a node of vibration of said piezoelectric body and an alternating voltage having a frequency depending upon said resonance frequency being applied to said input electrodes; and a generator portion positioned at approximately a mid-point along said length direction of said piezoelectric body;

a leading electrode positioned at substantially a center of said generator portion, said leading electrode taking-out an alternating voltage depending upon an alternating current applied to said first and second driving portions;

a grounding electrode forming a pair with said leading electrode, said ground electrode taking-out a voltage depending upon vibration of said piezoelectric body, said grounding electrode extending around the plate-shape in a width-wise direction of said piezoelectric body at a position of peak vibration of said piezoelectric body, said grounding electrode further having a portion extending on at least one side of said piezoelectric body to said node of vibration of said piezoelectric body, said grounding electrode further being electrically isolated from said input electrodes, wherein positions of junctions between external terminals and respective electrodes are matched with the node of vibration of said piezoelectric body.

4. A piezoelectric transformer as set forth in claim 3, wherein a position to apply said alternating voltage to said input electrodes and a position to take out said output voltage from said leading electrode and said grounding electrode are positions of nodes of vibration of said piezoelectric body.

5. A piezoelectric transformer as set forth in claim 3, wherein said grounding electrode has a projecting portion projecting to the take out position.

6. A piezoelectric transformer comprising:
a piezoelectric body having a disc-shape and having a diameter corresponding to ³⁄₂ of a wavelength corresponding to a resonance frequency;
a driving portion provided at substantially central portions of said piezoelectric body and having input electrodes formed on one primary surface and a second primary surface of said driving portion, said input electrodes having a portion being positioned at a node of vibration of said piezoelectric body and an alternating voltage having a frequency depending upon said resonance frequency being applied to said input electrodes; and
a generator portion located at a circumference of said piezoelectric body and having a leading electrode and a grounding electrode, said leading electrode being proximate to the grounding electrode and taking-out an alternating voltage depending upon an alternating current applied to said input electrodes and said grounding electrode forming a pair with said leading electrode for taking-out a voltage depending upon vibration of said piezoelectric body,
said grounding electrode being located at a position of peak vibration of said piezoelectric body and having a portion extending away from said grounding electrode to said node of vibration and further being electrically isolated from said input electrodes, said grounding electrode further extending circumferentially about the disc-shaped piezoelectric body and extending into portions of the driving portion,
wherein positions of junctions between external terminals and respective electrodes are matched with the node of vibration of said piezoelectric body.

7. A piezoelectric transformer as set forth in claim 6, wherein a position to apply said alternating voltage to said input electrode and a position to take-out said output voltage from said leading electrode and said grounding electrode are positions of nodes of vibration of said piezoelectric body.

8. A piezoelectric transformer as set forth in claim 6, wherein said grounding electrode has a projecting portion projecting to said take out position.

9. A driving method of a piezoelectric transformer at a resonance frequency in a longitudinal vibration tertiary mode, including a piezoelectric body in a polarized condition, input electrodes provided on a surface of said piezoelectric body and applied with an alternating voltage of a frequency depending upon a resonance frequency of the piezoelectric body, a leading electrode provided on the surface of said piezoelectric body and taking-out a voltage depending upon vibration of said piezoelectric body, a grounding electrode provided on the surface of said piezoelectric body at a position of peak vibration of said piezoelectric body, having a portion extending to a node of vibration of said piezoelectric body, and being electrically isolated from said input electrode and taking-out an output voltage in cooperation with said leading electrode by forming a pair, and external terminals connected with respective electrodes at a node of vibration of said piezoelectric body, wherein an alternating voltage having a frequency equal to the resonance frequency of said piezoelectric body is applied to said input electrodes.

10. A piezoelectric transformer comprising:
a piezoelectric body in a polarized condition;
first input electrodes provided at a first end of said piezoelectric body on opposing surfaces, said first input electrodes each having a portion positioned at a first node of vibration of said piezoelectric body;
second input electrodes provided on a second end of said piezoelectric body on opposing surfaces, said second input electrodes each having a portion positioned at a second node of vibration of said piezoelectric body;
a first leading electrode extending around said piezoelectric body between said first and said second input electrodes, said leading electrode taking out a voltage depending upon a vibration of said piezoelectric body; and
second leading electrodes extending around said piezoelectric body at a position of peak vibration of said piezoelectric body and being proximate to said first and said second input electrodes, respectively, said second leading electrodes further having leg extensions extending toward said first and said second input electrodes, respectively, on one surface of said piezoelectric body and extending to said first node and said second node of vibration of said piezoelectric body, respectively, said second leading electrodes further being electrically isolated from said input electrodes,
an output voltage being taken-out between said first leading electrode and said second leading electrodes, and positions of junctions between external terminals and respective electrodes are matched with the respective node of vibration of said piezoelectric body.

11. The piezoelectric transformer as set forth in claim 10, wherein said first leading electrode is provided at a third node of vibration of said piezoelectric body.

12. The piezoelectric transformer as set forth in claim 10, wherein said second leading electrodes are provided on different surfaces than said first and said second input electrodes.

13. The piezoelectric transformer as set forth in claim 10, wherein said second leading electrodes are provided on a same surface as said first and said second input electrodes.

14. The piezoelectric transformer as set forth in claim 13, wherein said second leading electrode leg extensions extend to opposing ends of said piezoelectric body.

15. The piezoelectric transformer as set forth in claim 10, wherein said first and said second input electrodes are substantially U-shaped.

16. The piezoelectric transformer as set forth in claim 15, wherein:
positions of opposing vertical legs of said U-shaped first input electrodes are positioned at said first node of vibration of said piezoelectric body,
positions of opposing vertical legs of said U-shaped second input electrodes are positioned at said second node of vibration of said piezoelectric body,
said second leading electrode leg extensions extend within said opposing vertical legs of one of said U-shaped first and said second input electrodes, and
positions of said second leading electrode leg extensions are positioned at one of said first and said second node of vibrations of said piezoelectric body.

17. The piezoelectric transformer as set forth in claim 10, wherein said second leading electrode leg extensions are provided on different surfaces of said piezoelectric body.

* * * * *